(12) United States Patent
Kang et al.

(10) Patent No.: US 10,955,113 B2
(45) Date of Patent: Mar. 23, 2021

(54) LIGHT-EMITTING MODULE

(71) Applicant: LG INNOTEK CO., LTD., Seoul (KR)

(72) Inventors: Ji Woon Kang, Seoul (KR); Hyun Keun Lee, Seoul (KR); Kwang Wook Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/488,425

(22) PCT Filed: Feb. 20, 2018

(86) PCT No.: PCT/KR2018/002051
§ 371 (c)(1),
(2) Date: Aug. 23, 2019

(87) PCT Pub. No.: WO2018/155875
PCT Pub. Date: Aug. 30, 2018

(65) Prior Publication Data
US 2020/0003392 A1    Jan. 2, 2020

(30) Foreign Application Priority Data
Feb. 24, 2017    (KR) .......................... 10-2017-0024587

(51) Int. Cl.
*F21V 7/04*    (2006.01)
*F21V 7/09*    (2006.01)
(Continued)

(52) U.S. Cl.
CPC .............. *F21V 7/09* (2013.01); *F21V 7/0016* (2013.01); *F21V 7/048* (2013.01); *F21V 7/06* (2013.01);
(Continued)

(58) Field of Classification Search
CPC .......... F21V 7/09; F21V 7/0016; F21V 7/048; F21V 7/06; H01L 25/0756; H05K 1/181;
(Continued)

(56) References Cited

U.S. PATENT DOCUMENTS

| 2009/0290349 A1 | 11/2009 | Chu et al. | |
| 2012/0140466 A1* | 6/2012 | Yang ...................... | F21V 7/0008 362/235 |
| 2013/0182432 A1* | 7/2013 | Yoo ....................... | F21V 19/001 362/235 |

FOREIGN PATENT DOCUMENTS

| CN | 103003624 | 3/2013 |
| JP | 2009-277355 | 11/2009 |

(Continued)

OTHER PUBLICATIONS

International Search Report dated Jun. 14, 2018 issued in Application No. PCT/KR2018/002051.
(Continued)

*Primary Examiner* — Donald L Raleigh
(74) *Attorney, Agent, or Firm* — KED & Associates LLP

(57) ABSTRACT

A light-emitting module provided in an embodiment comprises: a driving part disposed on a substrate and adjacent to one side of the substrate; a first light-emitting part adjacent to the other side of the substrate and disposed on one surface of the substrate; a second light-emitting part adjacent to the other side of the substrate, disposed on the other surface of the substrate, and emitting light different in wavelength from that emitted by the first light-emitting part; and a reflection part surrounding the first and the second light-emitting part and comprising a first and a second area facing the first and the second light-emitting part, respectively, wherein each of the first and the second light-emitting part may comprise one or more light-emitting chips, and the first and the second area may comprise a plurality of subareas having respective (Continued)

parabolic curves with reference to the light-emitting chips of each of the first and the second light-emitting part.

14 Claims, 13 Drawing Sheets

(51) Int. Cl.
*F21V 7/00* (2006.01)
*F21V 7/06* (2006.01)
*H01L 25/075* (2006.01)
*H05K 1/18* (2006.01)
*F21Y 107/90* (2016.01)
*F21Y 115/10* (2016.01)

(52) U.S. Cl.
CPC ......... *H01L 25/0756* (2013.01); *H05K 1/181* (2013.01); *F21Y 2107/90* (2016.08); *F21Y 2115/10* (2016.08); *H05K 2201/10106* (2013.01); *H05K 2201/10545* (2013.01)

(58) Field of Classification Search
CPC .......... H05K 2201/10106; H05K 2201/10545; F21Y 2107/90; F21Y 2115/10; F21Y 2113/10; F21S 41/148; F21K 9/68; G02B 26/12

See application file for complete search history.

(56) References Cited

FOREIGN PATENT DOCUMENTS

| | | |
|---|---|---|
| JP | 2010-080070 | 4/2010 |
| JP | 2015-118132 | 6/2015 |
| KR | 20-0387269 | 6/2005 |
| KR | 10-2006-0105887 | 10/2006 |
| KR | 10-2009-0012102 | 2/2009 |
| KR | 10-2011-0002862 | 1/2011 |
| KR | 10-2013-0084884 | 7/2013 |
| KR | 10-2017-0121840 | 11/2017 |

OTHER PUBLICATIONS

Chinese Office Action dated Apr. 15, 2020 issued in Application No. 201880027207.4.

European Search Report dated Feb. 6, 2020 issued in Application No. 18757304.3.

* cited by examiner

[FIG. 2]
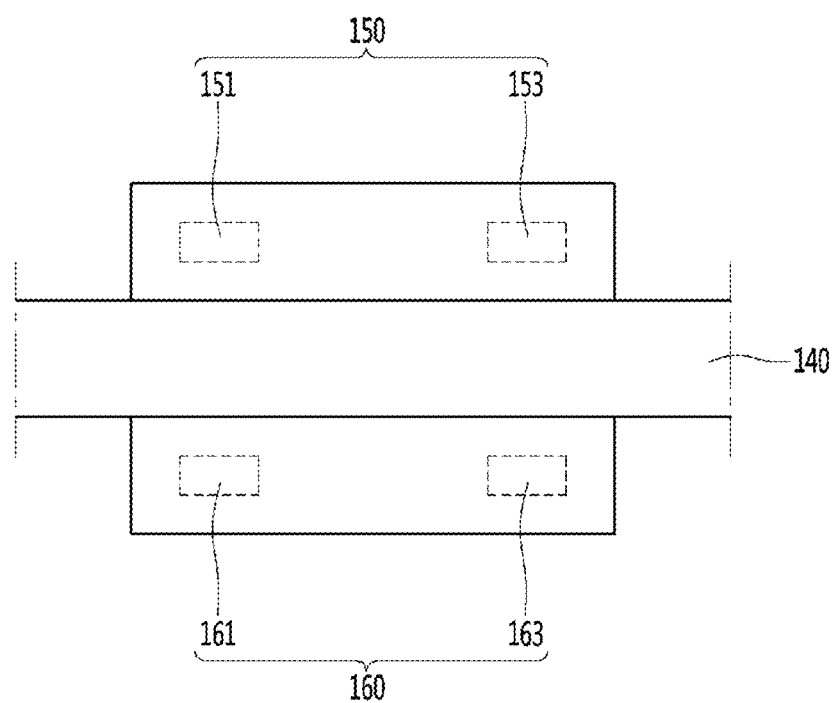

[FIG. 3]
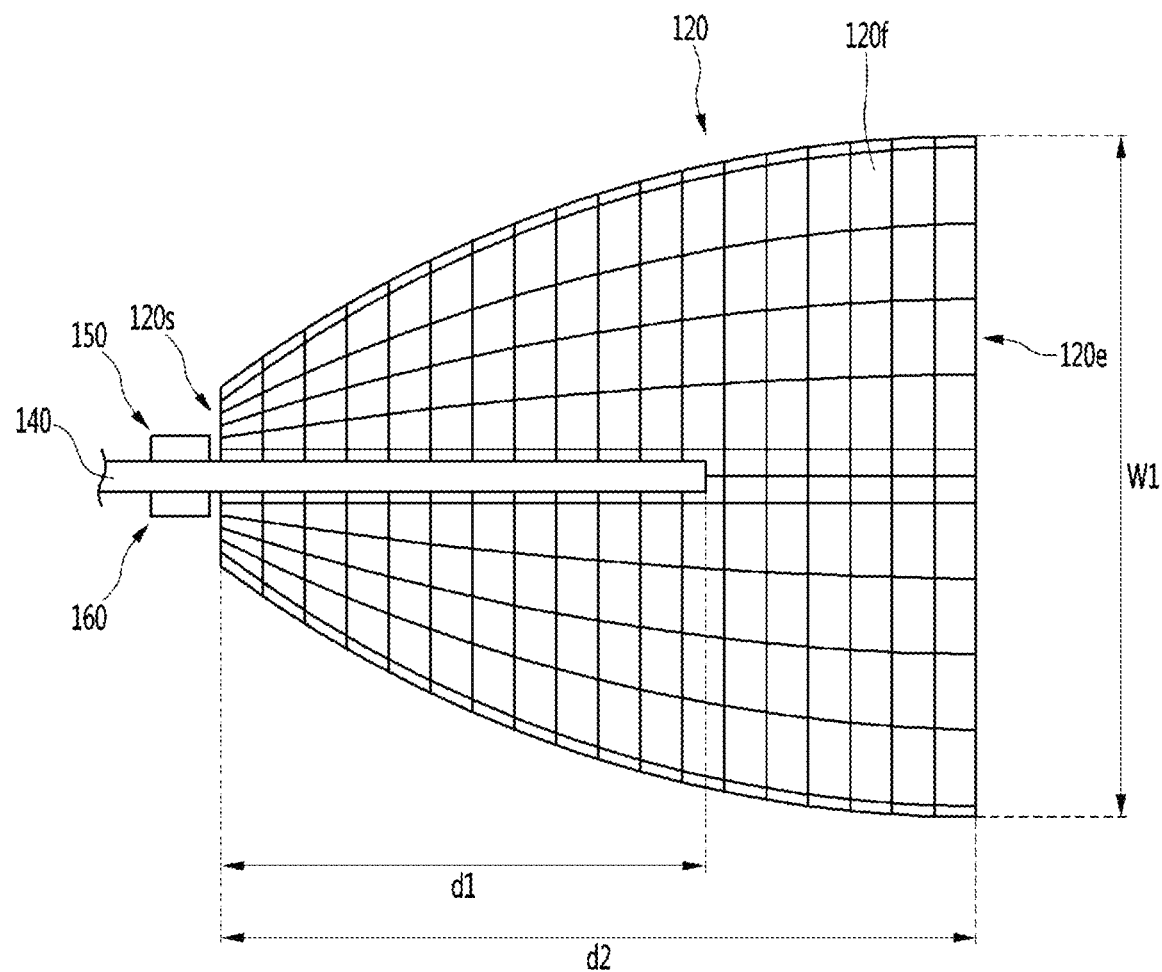

[FIG. 4]
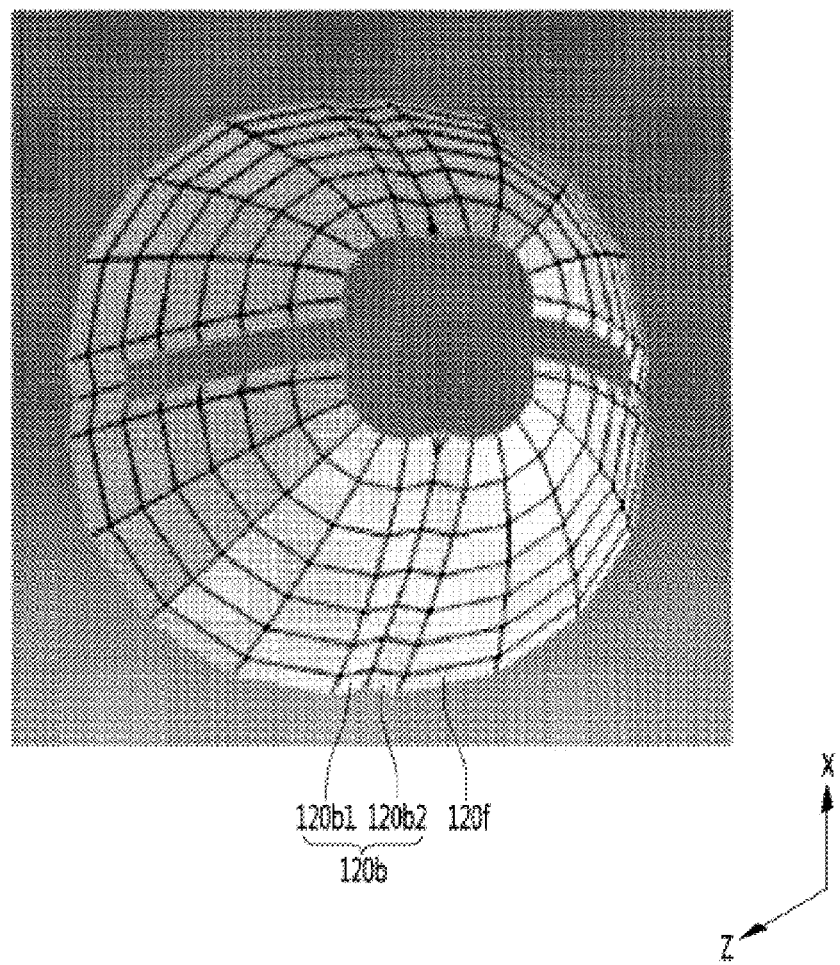
[FIG. 5]
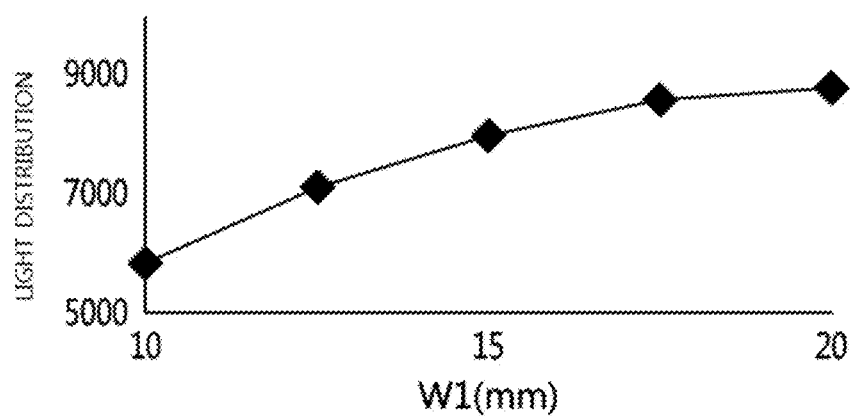

[FIG. 6]
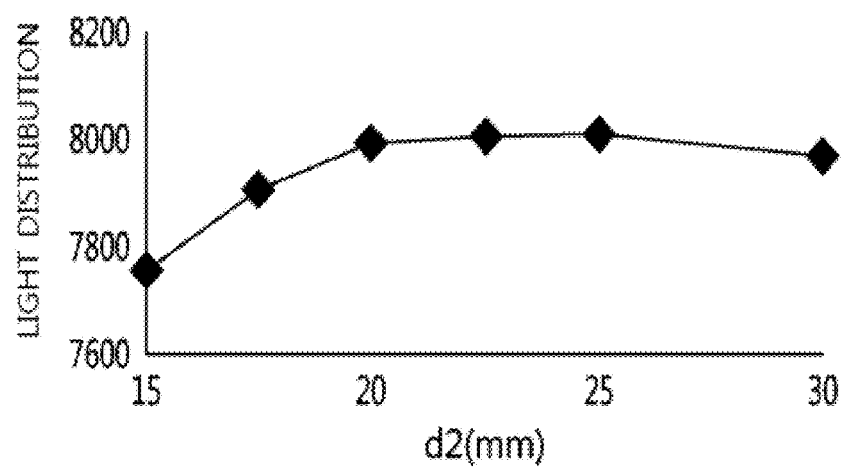
[FIG. 7]
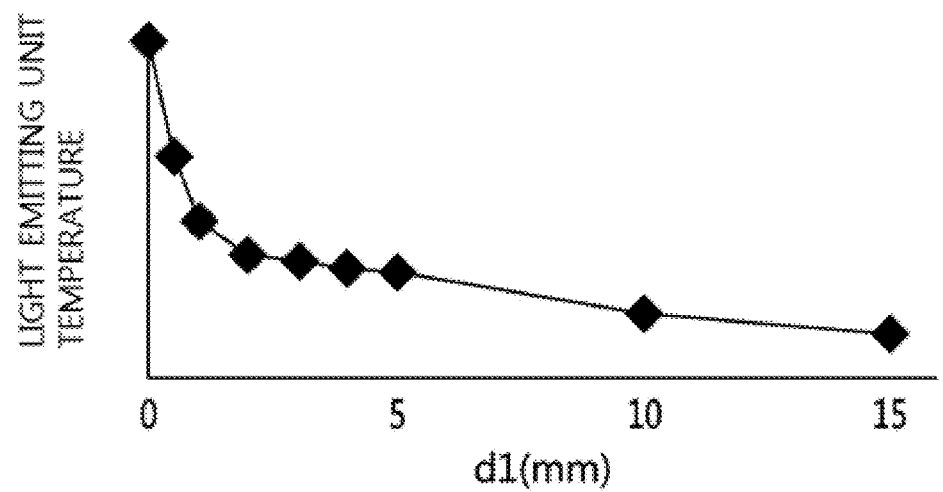

[FIG. 14]
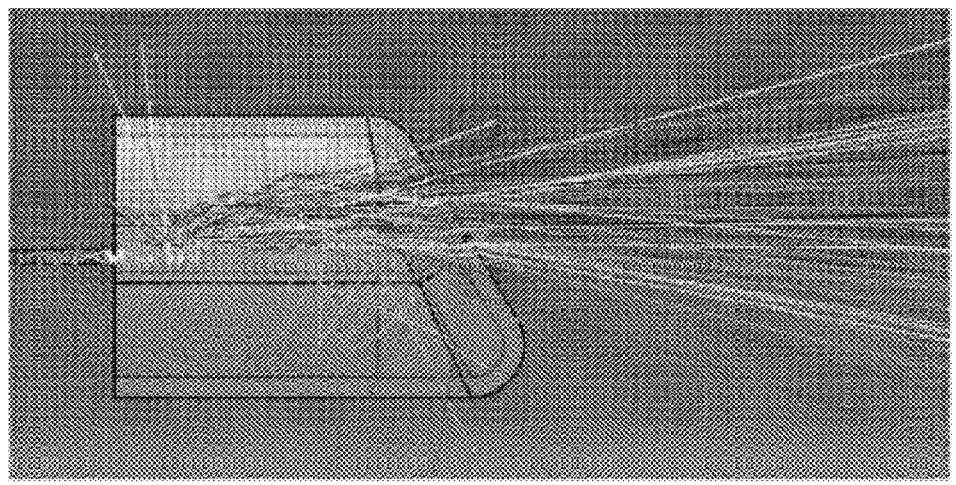
[FIG. 15]
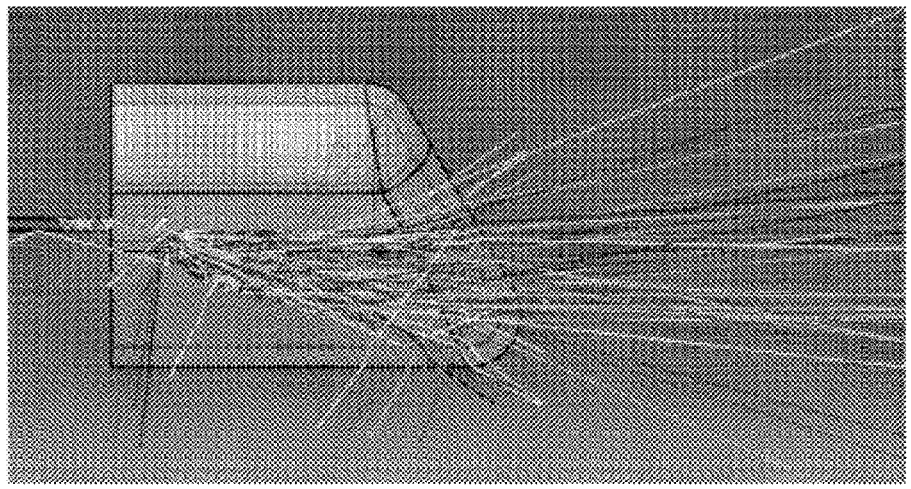

[FIG. 16]
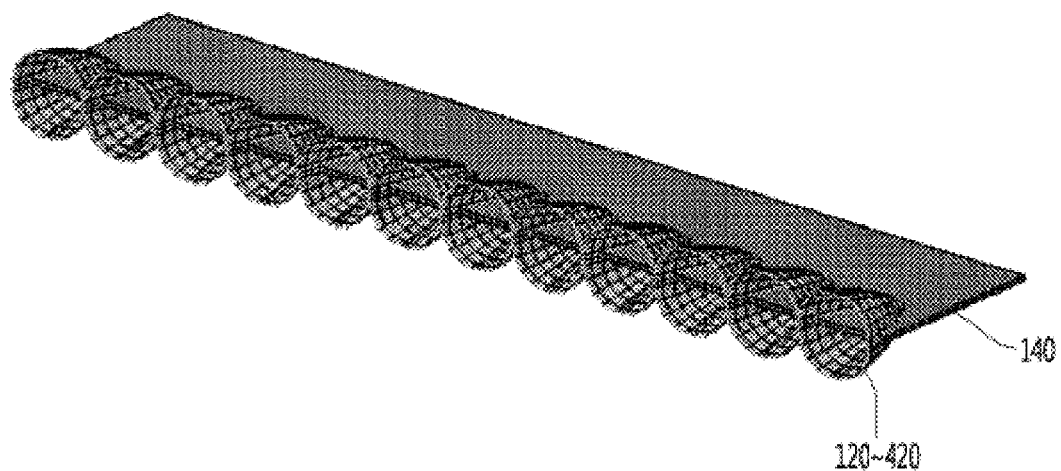

LIGHT-EMITTING MODULE

CROSS-REFERENCE TO RELATED PATENT APPLICATIONS

This application is a U.S. National Stage Application under 35 U.S.C. § 371 of PCT Application No. PCT/KR2018/002051, filed Feb. 20, 2018, which claims priority to Korean Patent Application No. 10-2017-0024587, filed Feb. 24, 2017, whose entire disclosures are hereby incorporated by reference.

TECHNICAL FIELD

Embodiments of the present invention relate to a light emitting module.

BACKGROUND ART

Semiconductor devices including compounds such as GaN, AlGaN, and the like can have many advantages such as wide and easily adjustable band gap energy and the like and can be variously used for semiconductor devices, light-receiving elements, and various diodes.

In particular, semiconductor devices such as light-emitting diodes or laser diodes using a compound semiconductor material including a III-V group element or a II-VI group element can realize various colors of light such as red light, green light, blue light, and ultraviolet light with the development of thin film growth technology and element materials and also realize white light having high efficiency by using a fluorescent material or combining colors. The semiconductor devices have advantages such as low power consumption, semi-permanent lifetime, fast response speed, safety, and environmental friendliness as compared to the conventional light sources such as fluorescent lamps, incandescent lamps, and the like.

In addition, light-receiving elements such as photodetectors or solar cells, which are manufactured using a compound semiconductor material including a III-V group element or a II-VI group element, can utilize light in various wavelength ranges from gamma rays to radio wavelengths by generating a photoelectric current by absorbing light in various wavelength ranges with the development of element materials. Further, the light-receiving elements have advantages such as fast response speed, safety, environmental friendliness, and simple control of element materials and thus can be easily used for power control, microwave circuits, or communication modules.

Therefore, semiconductor devices are increasingly applied to transmission modules of optical communication means, light-emitting diode backlights replacing cold-cathode fluorescent lamps (CCFLs) constituting backlights of liquid-crystal display (LCD) devices, white light-emitting diode lighting devices that can replace fluorescent lamps or incandescent bulbs, automotive headlights, traffic lights, and sensors that detect gas and fire. Further, the semiconductor devices can be widely applied to high frequency application circuits, other power control devices, and communication modules.

DISCLOSURE

Technical Problem

An embodiment of the present invention is directed to providing a light emitting module capable of increasing a light distribution, and a lighting system including the same.

Another embodiment of the present invention is directed to providing a light emitting module capable of improving reflection efficiency, and a lighting system including the same.

Still another embodiment of the present invention is directed to providing a light emitting module capable of improving luminous intensity of a central region and increasing a light distribution, and a lighting system including the same.

Yet another embodiment of the present invention is directed to providing a light emitting module capable of improving a degree of freedom in design by realizing slimming, and a lighting system including the same.

Yet another embodiment of the present invention is directed to providing a light emitting module for improving a light distribution and easily processing, and a lighting system including the same.

Technical Solution

A light emitting module according to an embodiment includes: a driving unit disposed on the substrate to be adjacent to one side of the substrate; a first light emitting unit disposed adjacent to another side of the substrate and disposed on one surface of the substrate; a second light emitting unit disposed adjacent to the other side of the substrate, disposed on another surface of the substrate, and configured to emit light having a wavelength different from that of the first light emitting unit; and a reflecting portion configured to surround the first light emitting unit and the second light emitting unit and including a first region and a second region facing the first light emitting unit and the second light emitting unit, wherein each of the first light emitting unit and the second light emitting unit includes at least one light emitting chip, and each of the first region and the second region includes a plurality of sub regions having a parabolic curve with respect to the light emitting chip of each of the first light emitting unit and the second light emitting unit.

According to the embodiment, the reflecting portion may include a plurality of facets, the reflecting portion may include an emission surface through which light is emitted, and have a width which gradually increases in a direction of the emission surface, and the plurality of facets may be disposed in each of the plurality of sub regions, wherein the facets adjacent to each other may have different inclination angles with respect to a first direction which is parallel to the one surface of the substrate.

According to the embodiment, the plurality of facets may have convex surfaces or concave surfaces on an inner side surface of the reflecting portion.

According to the embodiment, the plurality of facets may be provided with twelve or more facets in a circumferential direction and a depth direction of the reflecting portion.

According to the embodiment, the reflecting portion may include a bottom surface disposed on an opposite side of the emission surface, and the emission surface and the bottom surface may include boundary portions having inclination angles which are symmetrical to each other in boundary regions of the plurality of sub regions.

According to the embodiment, the boundary portion may include a first surface and a second surface which meet concavely along an outer side surface of the reflecting portion.

According to the embodiment, the boundary portion may extend from the plurality of sub regions, and meet each other corresponding to inclination angles of the plurality of sub regions along the outer side surface of the reflecting portion.

According to the embodiment, a ratio of the plurality of facets disposed in each of the plurality of sub regions may be obtained by the following expression, M:N (M≥8 and N>3), wherein the M denotes the number of facets disposed in the circumferential direction of the reflecting portion, and the N denotes the number of facets disposed in the depth direction the reflecting portion.

According to the embodiment, the plurality of facets may have the same width and the same area in the circumferential direction of the reflecting portion.

According to the embodiment, the first and second light emitting units may overlap each other in a direction of the substrate, and may be disposed on an outer periphery of the bottom surface of the reflecting portion.

According to the embodiment, the substrate may include an end protruding from the bottom surface of the reflecting portion to an inner side of the reflecting portion, and depths of the end and the reflecting portion may satisfy the following relationship, d1:d2 (1≤d1≤10, 10≤d2≤15), wherein d1 denotes a distance from the bottom surface of the reflecting portion to the end, and d2 denotes a distance in the depth direction of the reflecting portion.

A light emitting module according to an embodiment includes: a driving unit disposed on the substrate to be adjacent to one side of the substrate; a first light emitting unit disposed adjacent to another side of the substrate and disposed on one surface of the substrate; a second light emitting unit disposed adjacent to the other side of the substrate, disposed on another surface of the substrate, and configured to emit light having a wavelength different from that of the first light emitting unit; and a reflecting portion configured to surround the first light emitting unit and the second light emitting unit and including a first region and a second region facing the first light emitting unit and the second light emitting unit, wherein each of the first light emitting unit and the second light emitting unit includes at least one light emitting chip, and each of the first region and the second region includes a plurality of sub regions having a parabolic curve with respect to the light emitting chip of each of the first light emitting unit and the second light emitting unit and includes boundary portions having inclination angles which are symmetrical to each other in a boundary region of the first region and the second region.

According to the embodiment, the reflecting portion may include a plurality of facets, the reflecting portion may include an emission surface through which light is emitted and have a width which gradually increases in a direction of the emission surface, and the plurality of facets may be disposed in each of the plurality of sub regions, wherein the facets adjacent to each other may have different inclination angles with respect to a first direction which is parallel to the one surface of the substrate.

According to the embodiment, the first region may include a first sub region and a second sub region, the second region may include a third sub region and a fourth sub region, a facet disposed in a boundary region of the first and second sub regions among the plurality of facets may share the first and second sub regions, and a facet disposed in a boundary region of the third and fourth sub regions among the plurality of facets may share the first and second sub regions.

A lighting system according to an embodiment includes: any one of the plurality of light emitting modules disposed in the first direction described above; and a cover portion disposed on the light emitting module.

Advantageous Effects

According to an embodiment, it is possible to improve reflection efficiency by providing a reflecting portion including a plurality of sub regions having a parabolic curvature with respect to each of light emitting chips.

According to an embodiment, it is possible to reduce a width of an emission surface of a reflecting portion and realize slimming of the emission surface, thereby improving a degree of freedom in design.

According to an embodiment, the reduction of luminous intensity can be improved.

According to an embodiment, a plurality of facets can be included in a plurality of sub regions having a parabolic curvature with respect to each of light emitting chips to reflect light in various directions, thereby increasing a light distribution.

According to an embodiment, it is possible to improve workability by reducing the number of facets.

DESCRIPTION OF DRAWINGS

FIG. 2 is a view showing a light emitting unit of FIG. 1.

FIG. 3 is a cross-sectional view showing a light emitting module taken along line A-A of FIG. 1.

FIG. 4 is a perspective view showing a rear surface of a reflecting portion including facets in a first direction and a second direction.

FIG. 5 is a view showing a change in a light distribution according to a length in a first direction of a reflecting portion.

FIG. 6 is a view showing a change in a light distribution according to a length in a third direction of a reflecting portion.

FIG. 7 is a view showing a change in heat dissipation according to a length in a third direction of a substrate disposed inside a reflecting portion.

FIG. 14 is a view showing a distribution of light emitted from a first light emitting unit of FIG. 13.

FIG. 15 is a view showing a distribution of light emitted from a second light emitting unit of FIG. 13.

FIG. 16 is a perspective view showing the lighting system of FIG. 13.

MODES OF THE INVENTION

Figure 1:
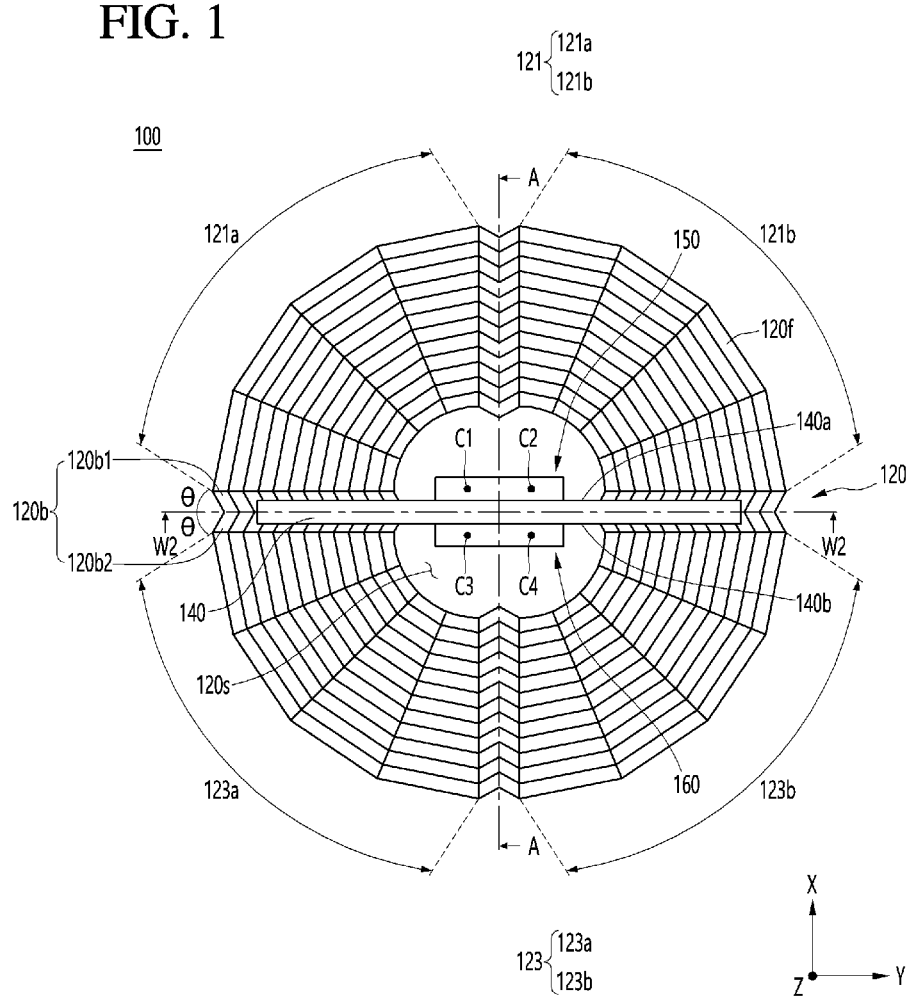
FIG. 1 is a plan view showing a light emitting module according to a first embodiment.

Hereinafter, exemplary embodiments of the present invention that are easily performed by those skilled in the art will be described in detail with reference to the accompanying drawings. However, the present invention may be implemented in various different forms and is not limited to the embodiments described herein.

In the following description, when there is an expression that some portion "includes" some structural elements, this means that some portion does not exclude another structural element, but may further include another structural element unless stated to the contrary. It will be understood that when a portion of a layer, a film, a region, a plate or the like is referred to as being "on" another portion, it can be "directly formed on" another portion, or a third portion can be interposed between the portions. Otherwise, when a portion is "directly formed on" another portion, it means that there is no third portion between the portions.

Further, structures and elements which do not relate to the detail description are not shown in the drawings to clearly describe the present invention, thicknesses may be exaggerated to clearly explain various layers and regions, and similar elements in the following description are designated by similar reference numerals.

FIG. 1 is a plan view showing a light emitting module according to a first embodiment, FIG. 2 is a view showing a light emitting unit of FIG. 1, FIG. 3 is a cross-sectional view showing a light emitting module taken along line A-A of FIG. 1, and FIG. 4 is a perspective view showing a rear surface of a reflecting portion including facets in a first direction and a second direction.

FIG. 5 is a view showing a change in a light distribution according to a length in a first direction of a reflecting portion, FIG. 6 is a view showing a change in a light distribution according to a length in a third direction of the reflecting portion, and FIG. 7 is a view showing a change in heat dissipation according to a length in a third direction of a substrate disposed inside a reflecting portion.

As shown in FIGS. 1 to 4, a light emitting module 100 according to a first embodiment may include a light emitting unit and a reflecting portion 120. The light emitting unit may include a substrate 140, a first light emitting unit 150 disposed on one surface 140a of the substrate 140, and a second light emitting unit 160 disposed on the other surface 140b of the substrate 140. That is, the first and second light emitting units 150 and 160 may be overlapped in a first direction X with the substrate 140 interposed therebetween. The first embodiment may have a cup-shaped reflecting portion 120 capable of improving reflection efficiency of light emitted from the first and second light emission parts 150 and 160 separated in the first direction X, thereby improving luminous intensity of a central region of an emission portion of the light emitting module 100 and improving light distribution efficiency.

The substrate 140 may include a circuit pattern (not shown) electrically connected to the first and second light emitting units 150 and 160. The substrate 400 may be a printed circuit board (PCB) including a circuit pattern (not shown). The substrate 140 may include at least one of a metal core PCB (MCPCB), a ceramic substrate, and a flexible PCB (FPCB) as well as a resin PCB. The substrate 140 may include a layer of a resist material for protecting the circuit pattern on a surface thereof or a layer of reflective material for reflection. A metal layer or a heat dissipation plate for heat dissipation may be disposed on a lower portion of the substrate 140.

The substrate 140 may include an end protruding in an inward direction of the reflecting portion 120. Here, the one surface 140a and the other surface 140b of the substrate 140 are disposed in parallel in a second direction Y orthogonal to the first direction X. The end of the substrate 140 may be disposed in a third direction Z orthogonal to the first and second directions X and Y. The end of the substrate 140 may be disposed in a direction from a bottom surface 120s of the reflecting portion 120 to an emission surface 120e.

In the first embodiment, a portion of the substrate 140 may be disposed inside the reflecting portion 120 so that a region in which heat generated from the first and second light emitting units 150 and 160 is conducted may be secured and heat dissipation may be improved. Specifically, a position of the end of the substrate 140 and a distance in a depth direction of the reflecting portion 120 may satisfy a relationship of d1:d2 ($1 \leq d1 \leq 10$ and $10 \leq d2 \leq 15$). Here, d1 denotes a distance d1 from a region in which the first and second light emitting units 150 and 160 are disposed to the end of the substrate 140, and d2 denotes a distance d2 in the depth direction of the reflecting portion 120. Here, the depth direction of the reflecting portion 120 may correspond to the third direction Z.

In the case in which the relationship of d1:d2 ($d1<1$ and $10 \leq d2 \leq 15$) is satisfied, heat dissipation efficiency may be lowered due to the short distance from the region in which the first and second light emitting units 150 and 160 are disposed to the end of the substrate 140 so that the lifetimes of the first and second light emitting units 150 and 160 may be lowered. In the case in which the relationship of d1:d2 ($d1>10$ and $10 \leq d2 \leq 15$) is satisfied, the end of the substrate 140 is adjacent to the emission surface 120e of the reflecting portion 120, and thus it may be difficult to satisfy a light distribution criterion by blocking a light path due to the substrate 140.

In the case in which the relationship of d1:d2 ($1 \leq d1 \leq 10$ and $d2<10$) is satisfied, the end of the substrate 140 is adjacent to the emission surface 120e of the reflecting portion 120, and thus it may be difficult to satisfy the light distribution criterion by blocking the light path due to the substrate 140. In the case in which the relationship of d1:d2 ($1 \leq d1 \leq 10$ and $d2>15$) is satisfied, a total size of the light emitting module 100 is increased due to the reflecting portion 120 as the depth of the reflecting portion 120 is increased, and thus it may be difficult to slim and thin the light emitting module 100.

The distance, d1, may range from 2 mm to 20 mm, and the distance, d2, may range from 20 mm to 30 mm. Specifically, the distance, d1, may range from 2 mm to 16 mm, and the distance, d2, may range from 20 mm to 30 mm. When the distance, d1, is less than 2 mm, heat dissipation efficiency may be lowered, and when the distance, d1, is more than 20 mm, the heat dissipation efficiency may be lowered, and it may be difficult to satisfy the light distribution criterion by blocking the light path due to the substrate 140. When the distance, d2, is less than 20 mm, the emission surface 120e of the reflecting portion 120 is adjacent to the substrate 140, and thus it may be difficult to satisfy the light distribution criterion by blocking the light path due to the substrate 140, and when the distance, d2, is more than 30 mm, the total size of the light emitting module 100 is increased, and thus it may be difficult to slim and thin the light emitting module 100.

Referring to FIGS. 6 and 7, in the light emitting module 100 of the first embodiment, the end of the substrate 140 may protrude in the inward direction of the reflecting portion 120, and thus not only a heat dissipation function may be improved but also the light distribution criterion may be satisfied.

The first light emitting unit 150 may be disposed on the one surface 140a of the substrate 140. The second light emitting unit 160 may be disposed on the other surface 140b of the substrate 140. The first and second light emitting units 150 and 160 may overlap each other in the first direction X with the substrate 140 interposed therebetween. The first and second light emitting units 150 and 160 may emit light having different wavelengths. Accordingly, the light emitting module 100 of the first embodiment may selectively emit light having different wavelengths.

The first light emitting unit 150 may include at least one light emitting chip. The first light emitting unit 150 of the first embodiment may be a two-chip semiconductor device package including first and second light emitting chips 151 and 153. The first and second light emitting chips 151 and 153 may emit light having the same wavelength. For example, the first light emitting unit 150 may emit light having a white wavelength.

The second light emitting unit 160 may include at least one light emitting chip. The second light emitting unit 160 of the first embodiment may be a two-chip semiconductor device package including third and fourth light emitting chips 161 and 163. The third and fourth light emitting chips 161 and 163 may emit light having the same wavelength. For example, the second light emitting unit 160 may emit light having at least one of a yellow wavelength, a red wavelength, and an orange wavelength.

The first and second light emitting units 150 and 160 may emit light in at least one of wavelength bands of ultraviolet (UV) rays, visible rays, and infrared rays. The first and second light emitting units 150 and 160 may include a layer or a film having a phosphor, but the present invention is not limited thereto. The first to fourth light emitting chips 151, 153, 161, and 163 may each include at least one of an UV light-emitting diode (LED) chip, a green LED chip, a blue LED chip, a red LED chip, and an infrared LED chip. The first to fourth light emitting chips 151, 153, 161, and 163 may each include, for example, a blue LED chip. The first to fourth light emitting chips 151, 153, 161, and 163 may each include at least one of a III-V group compound semiconductor and a II-VI group compound semiconductor. The first to fourth light emitting chips 151, 153, 161, and 163 may each include a light emitting structure in which compound semiconductor layers are stacked. The light emitting structure may include a first conductive semiconductor layer, an active layer, and a second conductive semiconductor layer. The first to fourth light emitting chips 151, 153, 161, and 163 may be disposed in a flip chip manner, or may be disposed in a vertical chip structure or a horizontal chip structure.

The first and second light emitting units 150 and 160 may be disposed adjacent to the bottom surface 120s of the reflecting portion 120 and may not be disposed inside the reflecting portion 120. The first and second light emitting units 150 and 160 may be a side view type in which light is emitted in one direction, and light emitting directions of the first and second light emitting units 150 and 160 may be the third direction Z.

Specifically, the first and second light emitting units 150 and 160 may be disposed on an outer periphery of the reflecting portion 120. One side surface of each of the first and second light emitting units 150 and 160 may be disposed on the same plane as the bottom surface 120s of the reflecting portion 120 in the first direction X and the second direction Y, but the present invention is not limited thereto. The first and second light emitting units 150 and 160 may be disposed on the outer periphery of the reflecting portion 120, and thus reflection efficiency of the light emitted from the first and second light emitting units 150 and 160 may be increased. Further, since the first and second light emitting units 150 and 160 are disposed on the outer periphery of the reflecting portion 120 so that the first and second light emitting units 150 and 160 are exposed to the outside, a heat dissipation characteristic may be improved. When the first and second light emitting units 150 and 160 are disposed inside the reflecting portion 120, a path of light may be restricted around a region of the reflecting portion 120 in which the side view type first and second light emitting units 150 and 160 are disposed. That is, the reflection efficiency may be lowered in a region of the reflecting portion 120, which overlaps the first and second light emitting units 150 and 160 in the first direction X and the second direction Y.

As another example, the first and second light emitting units 150 and 160 may be spaced a predetermined interval from the reflection surface 120s of the reflecting portion 120 in the third direction Z. The first and second light emitting units 150 and 160 may be spaced the predetermined interval from the reflection surface 120 in the third direction Z under a condition that light is not lost around the bottom surface 120s of the reflecting portion 120 according to a light distribution characteristic. In another example, the first and second light emitting units 150 and 160 may be easily repaired when the first and second light emitting units 150 and 160 are defective, and the heat dissipation characteristic may be improved due to a space in which the first and second light emitting units 150 and 160 are spaced apart from the reflecting portion 120.

As still another example, at least a portion of each of the first and second light emitting units 150 and 160 may be disposed inside the reflecting portion 120. At least a portion of each of the first and second light emitting units 150 and 160 may be disposed inside the reflecting portion 120 according to the light distribution characteristic. The first and second light emitting units 150 and 160 may be disposed inside the reflecting portion 120 under a condition that reflection efficiency is not lowered. In still another example, the first and second light emitting units 150 and 160 may be disposed inside the reflecting portion 120 so that the first and second light emitting units 150 and 160 may be improved from being damaged by an external force.

The reflecting portion 120 may have a cup structure including the bottom surface 120s which is adjacent to the first and second light emitting units 150 and 160 and the emission surface 120e through which light is emitted. The emission surface 120e and the bottom surface 120s may have a hole structure and may have the same shape, but the present invention is not limited thereto. A width of the emission surface 120e may be greater than a width of the bottom surface 120s. For example, a first width W1 of the emission surface 120e in the first direction may be equal to a second width W2 in the second direction Y, or may be smaller than the second width W2. For example, the first and second widths W1 and W2 may satisfy a relationship of W1:W2 ($0.5 \leq W2 \leq 1$ and W2=1). Here, W1 denotes the width of the emission surface 120e of the reflecting portion 120 in the first direction X in which the first and second light emitting units 150 and 160 overlap, and W2 denotes the width of the emission surface 120e orthogonal to the width, W1. Here, the width, W2, may correspond to the second direction Y.

Specifically, the first width W1 may range from 10 mm to 20 mm, and the second width W2 may be 20 mm. Here, the second width W2 is not limited to 20 mm, and may be changed according to a design requirement or a light distribution requirement of a lighting system. The first width W1 may be changed due to the second width W2 in a range that satisfies the relationship of W1:W2 ($0.5 \leq W2 \leq 1$ and W2=1).

Referring to FIG. 5, as the first width W1 increases, a light distribution in the first direction X may increase. For example, the first width W1 may realize a maximum light distribution under the same condition as the second width W2. The light emitting module 100 of the first embodiment may satisfy the light distribution criterion due to a relative ratio condition of the first and second widths W1 and W2 of the reflecting portion 120.

The reflecting portion 120 may include a first region 121 in which light of the first light emitting unit 150 is reflected, and a second region 123 in which light of the second light emitting unit 160 is reflected.

The first region 121 may face the first light emitting unit 150. The first region 121 may face the one surface 140a of the substrate 140. The first region 121 may include a first sub region 121a and a second sub region 121b having different parabolic curve. Specifically, the first sub region 121a may have a parabola from a first reference C1 on which the first light emitting chip 151 is disposed. The second sub region 121b may have a parabola from a second reference C2 on which the second light emitting chip 153 is disposed. The light emitting module 100 of the first embodiment may provide the reflecting portion 120 having a parabolic curvature with respect to positions of the first and second light emitting chips 151 and 153, and thus a light distribution of the light emitting module 100 may be increased in consideration of the first and second light emitting chips 151 and 153 that emit light.

The second region 123 may face the second light emitting unit 160. The second region 123 may face the other surface 140b of the substrate 140. The second region 123 may include a third sub region 123a and a fourth sub region 123b having different parabolic curve. Specifically, the third sub region 123a may have a parabola from a third reference C1 on which the third light emitting chip 161 is disposed. The fourth sub region 123a may have a parabola from a fourth reference C4 on which the fourth light emitting chip 163 is disposed. The light emitting module 100 of the first embodiment may provide the reflecting portion 120 having a parabolic curvature with respect to positions of the third and fourth light emitting chips 161 and 163, and thus the light distribution of the light emitting module 100 may be increased in consideration of the third and fourth light emitting chips 161 and 163 that emit light.

The reflecting portion 120 of the first embodiment may include a plurality of facets 120f. Here, the plurality of facets 120f may be provided on a surface of the reflecting portion 120 with a plurality of surfaces having different inclination angles. The plurality of facets 120f may provide light reflected in various directions at different inclination angles so that the light distribution of the light emitting module 100 may be increased. The plurality of facets 120f may have a concave surface shape. The plurality of facets 120f may have a convex surface shape. Further, the plurality of facets 120f may have a structure in which the concave surfaces or convex surfaces of the facets adjacent to each other are connected.

The plurality of facets 120f of the first embodiment may be provided with twelve or more facets 120f in a circumferential direction of the reflecting portion 120. Further, the plurality of facets 120f may be provided with twelve or more facets 120f in a depth direction corresponding to the third direction Z of the reflecting portion 120. As the number of the facets 120f is increased in the circumferential direction and the depth direction of the reflecting portion 120, there are various reflection angles of light, and thus the light distribution may be increased.

The reflecting portion 120 may include boundary portions 120b disposed between the first to fourth sub regions 121a, 121b, 123a, and 123b. The boundary portions 120b may each include a first surface 120b1 and a second surface 120b2 having inclination angles θ which are symmetrical to each other. For example, the first surface 120b1 may extend from the first region 121, and the second surface 120b2 may extend from the second region 123. The boundary portion 120b may include the plurality of facets 120f, and the number of the facets 120f in the third direction Z may correspond to the number of the facets 120f in the depth direction corresponding to the third direction Z of each of the first to fourth sub regions 121a, 121b, 123a, and 123b.

The first and second surfaces 120b1 and 120b2 may meet each other concavely in an inward direction of the reflecting portion 120 on an outer side surface of the reflecting portion 120. The first and second surfaces 120b1 and 120b2 may extend according to the parabolic curvature of each of the first to fourth sub regions 121a, 121b, 123a, and 123b which are connected to each other. That is, the boundary portion 120b may have a structure formed concavely along the outer periphery of the reflecting portion 120.

In the first embodiment, the reflecting portion 120 including the plurality of sub regions having the parabolic curvature with respect to each of the light emitting chips may be provided, and thus the reflection efficiency may be improved. Therefore, in the first embodiment, the first and second widths W1 and W2 of the emission surface 120e of the reflecting portion 120 may be reduced to be smaller than in a general reflection structure, and thus the slimming of the emission surface 120e of the light emitting module 100 may be realized. Accordingly, the first embodiment may be provided to lighting systems in various designs, and thus a degree of freedom in design may be improved.

Further, in the first embodiment, in the light emitting module 100 in which the first and second light emitting units 150 and 160 having different wavelengths are disposed with the substrate 140 interposed therebetween, the reflecting portion 120 including the plurality of sub regions having a parabolic curvature with respect to each of the light emitting chips included in the first and second light emitting units 150 and 160 may be provided, and thus the reduction of luminous intensity in a central region of the emission surface 120e of the light emitting module 100 may be improved.

Further, in the first embodiment, the first and second widths W1 and W2 of the emission surface 120e of the reflecting portion 120 satisfying the relationship of W1:W2 ($0.5 \leq W2 \leq 1$ and $W2=1$) may be provided, and thus the light distribution may be increased.

Further, in the first embodiment, the plurality of facets 120f may be included in each of the sub regions to reflect light in various directions, thereby increasing the light distribution.

Figure 8:
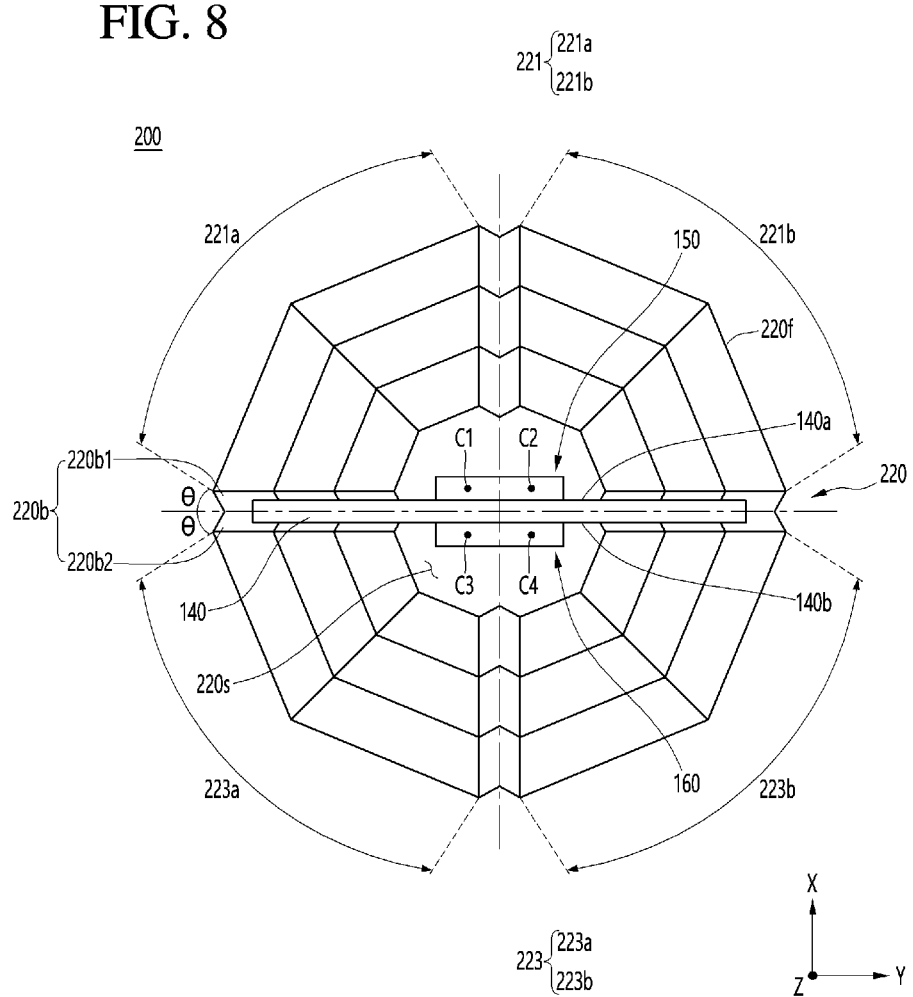
FIG. 8 is a plan view showing a light emitting module according to a second embodiment.
Figure 9:
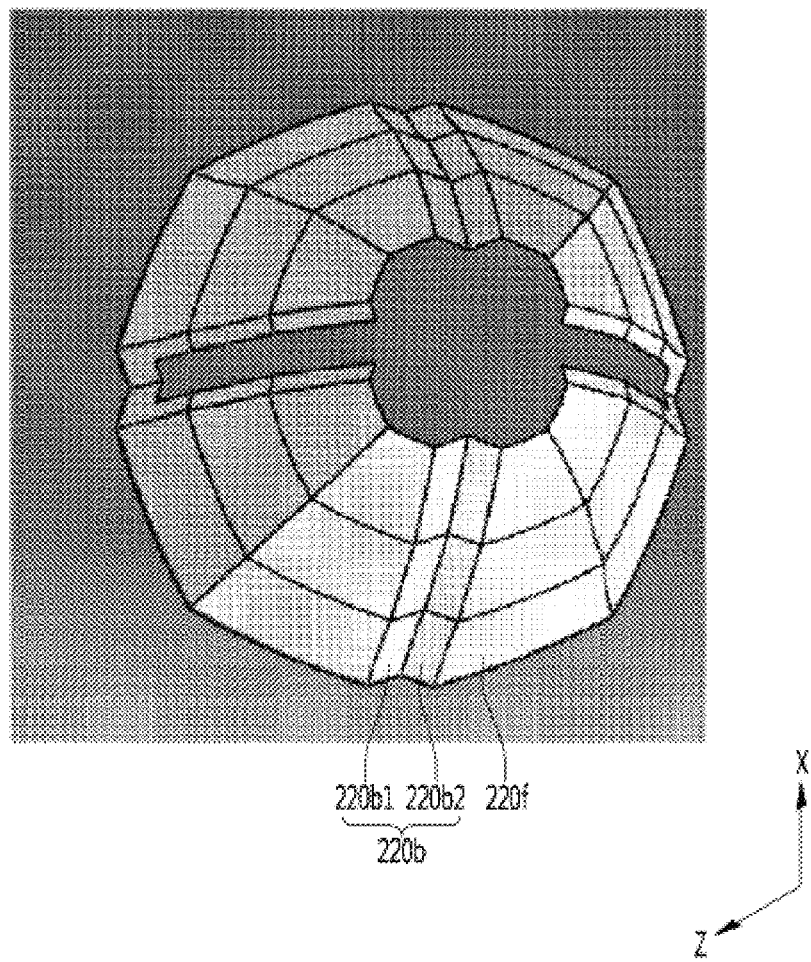
FIG. 9 is a perspective view showing a rear surface of a reflecting portion including facets in a first direction and a second direction according to the second embodiment

FIG. 8 is a plan view showing a light emitting module according to a second embodiment, and FIG. 9 is a perspective view showing a rear surface of a reflecting portion including facets in a first direction and a second direction according to the second embodiment.

In the description of a light emitting module 200 of the second embodiment with reference to FIGS. 8 and 9, descriptions identical to those of the contents described with reference to FIGS. 1 to 7 may be omitted.

The technical features of the light emitting module of the first embodiment may be employed to a width of an emission surface of a reflecting portion 220.

The reflecting portion 220 may include a first region 221 in which light of a first light emitting unit 150 is reflected, and a second region 223 in which light of a second light emitting unit 160 is reflected.

The first region 221 may face the first light emitting unit 150. The first region 221 may face one surface 140a of a substrate 140. The first region 221 may include a first sub region 221a and a second sub region 221b having different parabolic curve. Specifically, the first sub region 221a may have a parabola from a first reference C1 on which a first light emitting chip 151 is disposed. The second sub region 221b may have a parabola from a second reference C2 on which a second light emitting chip 153 is disposed. The light emitting module 200 of the first embodiment may provide the reflecting portion 220 having a parabolic curvature with respect to positions of the first and second light emitting chips 151 and 153, and thus a light distribution of the light emitting module 200 may be increased in consideration of the first and second light emitting chips 151 and 153 that emit light.

The second region 223 may face the second light emitting unit 160. The second region 223 may face another surface 140b of the substrate 140. The second region 223 may include a third sub region 223a and a fourth sub region 223b having different parabolic curve. Specifically, the third sub region 223a may have a parabola from a third reference C1 on which a third light emitting chip 161 is disposed. The fourth sub region 223b may have a parabola from a fourth reference C4 on which a fourth light emitting chip 163 is disposed. The light emitting module 200 of the first embodiment may provide the reflecting portion 220 having a parabolic curvature with respect to positions of the third and fourth light emitting chips 161 and 163, and thus the light distribution of the light emitting module 200 may be increased in consideration of the third and fourth light emitting chips 161 and 163 that emit light.

The reflecting portion 220 of the second embodiment may include a plurality of facets 220f. Here, the plurality of facets 220f may be provided on a surface of the reflecting portion 220 with a plurality of surfaces having different inclination angles. The plurality of facets 220f may provide light reflected in various directions at different inclination angles so that the light distribution of the light emitting module 200 may be increased. The plurality of facets 220f may have a concave surface shape. The plurality of facets 220f may have a convex surface shape. Further, the plurality of facets 220f may have a structure in which the concave surfaces or convex surfaces of the facets adjacent to each other are connected.

The plurality of facets 220f of the second embodiment may be provided with ten or less facets 220f in a circumferential direction of the reflecting portion 220. For example, the plurality of facets 220f may be provided with eight facets 220f in the circumferential direction of the reflecting portion 220. Further, the plurality of facets 220f may be provided with five or less facets 220f in a depth direction corresponding to a third direction Z of the reflecting portion 220. For example, the plurality of facets 220f may be provided with three facets 220f in the depth direction corresponding to the third direction Z of the reflecting portion 220. The number of the facets 220f may be reduced at a level of 25% of that in the first embodiment, and thus the workability of the reflecting portion 220 for forming the plurality of facets 220f may be improved.

The reflecting portion 220 may include boundary portions 220b disposed between the first to fourth sub regions 221a, 221b, 223a, and 223b. The boundary portions 220b may each include a first surface 220b1 and a second surface 220b2 having inclination angles θ which are symmetrical to each other. For example, the first surface 220b1 may extend from the first sub region 221a, and the second surface 220b2 may extend from the third sub region 223a. The boundary portion 220b may include the plurality of facets 220f, and the number of the facets 220f in the third direction Z may correspond to the number of the facets 220f in the depth direction corresponding to the third direction Z of each of the first to fourth sub regions 221a, 221b, 223a, and 223b.

The first and second surfaces 220b1 and 220b2 may meet each other concavely in an inward direction of the reflecting portion 220 on an outer side surface of the reflecting portion 220. The first and second surfaces 220b1 and 220b2 may extend according to the parabolic curvature of each of the first to fourth sub regions 221a, 221b, 223a, and 223b which are connected to each other. That is, the boundary portion 220b may have a structure formed concavely along an outer periphery of the reflecting portion 220.

In the second embodiment, the reflecting portion 220 including the plurality of sub regions having the parabolic curvature with respect to each of the light emitting chips may be provided, and thus the reflection efficiency may be improved. Therefore, in the second embodiment, a width of the emission surface of the reflecting portion 220 may be reduced to be smaller than in a general reflection structure, and thus the slimming of the emission surface of the light emitting module 200 may be realized. Accordingly, the second embodiment may be provided to lighting systems in various designs, and thus a degree of freedom in design may be improved.

Further, in the second embodiment, in the light emitting module 200 in which the first and second light emitting units 150 and 160 having different wavelengths are disposed with the substrate 140 interposed therebetween, the reflecting portion 220 including the plurality of sub regions having a parabolic curvature with respect to each of the light emitting chips included in the first and second light emitting units 150 and 160 may be provided, and thus the reduction of luminous intensity in a central region of the emission surface of the light emitting module 200 may be improved.

Further, in the second embodiment, the plurality of facets 220f may be included in each of the first to fourth sub regions 221a, 221b, 223a, and 223b and the boundary portions 220b to reflect light in various directions, thereby increasing the light distribution.

Further, in the second embodiment, the number of the facets 200f may be reduced at a level of 25% of that in the first embodiment, and thus the workability of the reflecting portion 220 for forming the plurality of facets 220f may be improved.

Figure 10:
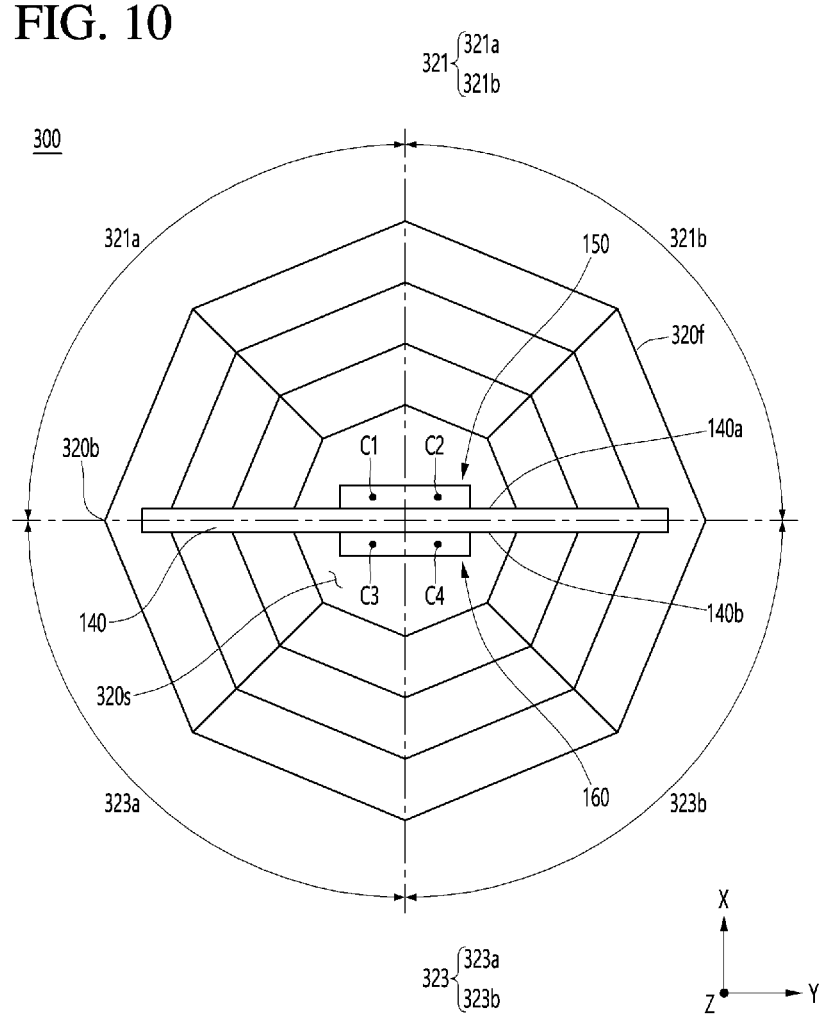
FIG. 10 is a cross-sectional view showing a light emitting module according to a third embodiment.

FIG. 10 is a cross-sectional view showing a light emitting module according to a third embodiment.

Figure 11:
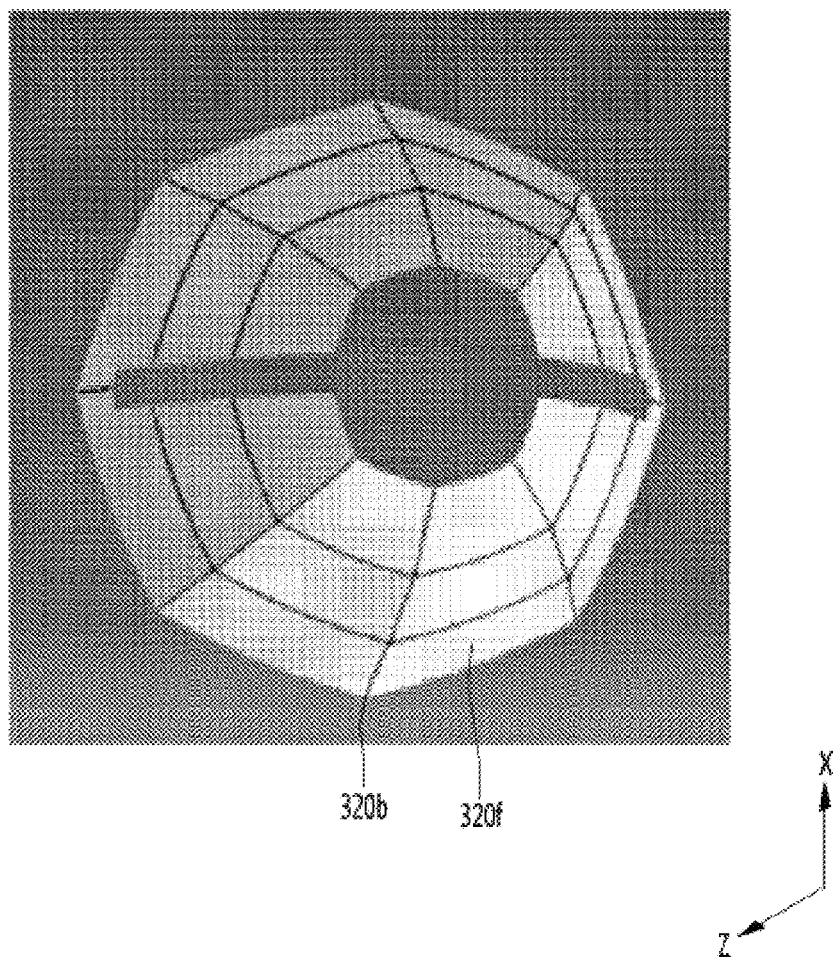
FIG. 11 is a perspective view showing a rear surface of a reflecting portion including facets in a first direction and a second direction according to the third embodiment.

FIG. 11 is a perspective view showing a rear surface of a reflecting portion including facets in a first direction and a second direction according to the third embodiment.

In the description of a light emitting module 300 of the third embodiment with reference to FIGS. 10 and 11, descriptions identical to those of the contents described with reference to FIGS. 1 to 7 may be omitted.

The technical features of the light emitting module of the first embodiment may be employed to a width of an emission surface of a reflecting portion 320.

The reflecting portion 320 may include a first region 321 in which light of a first light emitting unit 150 is reflected, and a second region 323 in which light of a second light emitting unit 150 is reflected.

The first region 321 may face the first light emitting unit 150. The first region 321 may face one surface 140a of a substrate 140. The first region 321 may include a first sub region 321a and a second sub region 321b having different parabolic curve. Specifically, the first sub region 321a may have a parabola from a first reference C1 on which a first light emitting chip 151 is disposed. The second sub region 321b may have a parabola from a second reference C2 on which a second light emitting chip 153 is disposed. The light emitting module 300 of the third embodiment may provide the reflecting portion 320 having a parabolic curvature with respect to positions of the first and second light emitting chips 151 and 153, and thus a light distribution of the light emitting module 300 may be increased in consideration of the first and second light emitting chips 151 and 153 that emit light.

The second region 323 may face the second light emitting unit 160. The second region 323 may face another surface 140b of the substrate 140. The second region 323 may include a third sub region 323a and a fourth sub region 323b having different parabolic curve. Specifically, the third sub region 323a may have a parabola from a third reference C3 on which a third light emitting chip 161 is disposed. The fourth sub region 323b may have a parabola from a fourth reference C4 on which a fourth light emitting chip 163 is disposed. The light emitting module 300 of the third embodiment may provide the reflecting portion 320 having a parabolic curvature with respect to positions of the third and fourth light emitting chips 161 and 163, and thus the light distribution of the light emitting module 300 may be increased in consideration of the third and fourth light emitting chips 161 and 163 that emit light.

The reflecting portion 320 of the third embodiment may include a plurality of facets 320f. Here, the plurality of facets 320f may be provided on a surface of the reflecting portion 320 with a plurality of surfaces having different inclination angles. The plurality of facets 320f may provide light reflected in various directions at different inclination angles so that the light distribution of the light emitting module 300 may be increased. The plurality of facets 320f may have a concave surface shape. The plurality of facets 320f may have a convex surface shape. Further, the plurality of facets 320f may have a structure in which the concave surfaces or convex surfaces of the facets adjacent to each other are connected.

The plurality of facets 320f of the third embodiment may be provided with ten or less facets 320f in a circumferential direction of the reflecting portion 320. For example, the plurality of facets 320f may be provided with eight facets 320f in the circumferential direction of the reflecting portion 320. Further, the plurality of facets 320f may be provided with five or less facets 320f in a depth direction corresponding to a third direction Z of the reflecting portion 320. For example, the plurality of facets 320f may be provided with three facets 320f in the depth direction corresponding to the third direction Z of the reflecting portion 320. The number of the facets 320f may be reduced at a level of 50% of that in the second embodiment, and thus the workability of the reflecting portion 320 for forming the plurality of facets 320f may be improved.

In the third embodiment, the first to fourth sub regions 321a, 321b, 323a, and 323b may be connected to each other. For example, the first sub region 321a and the second sub region 321b may be connected to each other, the first sub region 321a and the third sub region 323a may be connected to each other, the second sub region 321b and the fourth sub region 323b may be connected to each other, and the third sub region 323a and the fourth sub region 323b may be connected to each other. Boundary regions of the first to fourth sub regions 321a, 321b, 323a, and 323b may be in direct contact with each other in a structure formed convexly along an outer periphery of the reflecting portion 320.

In the third embodiment, the reflecting portion 320 including the plurality of sub regions having the parabolic curvature with respect to each of the light emitting chips may be provided, and thus the reflection efficiency may be improved. Therefore, in the second embodiment, a width of the emission surface of the reflecting portion 320 may be reduced to be smaller than in a general reflection structure, and thus the slimming of the emission surface of the light emitting module 300 may be realized. Accordingly, the third embodiment may be provided to lighting systems in various designs, and thus a degree of freedom in design may be improved.

Further, in the third embodiment, in the light emitting module 300 in which the first and second light emitting units 150 and 160 having different wavelengths are disposed with the substrate 140 interposed therebetween, the reflecting portion 320 including the plurality of sub regions having a parabolic curvature with respect to each of the light emitting chips included in the first and second light emitting units 150 and 160 may be provided, and thus the reduction of luminous intensity in a central region of the emission surface of the light emitting module 300 may be improved.

Further, in the third embodiment, the plurality of facets 320f may be included in each of the first to fourth sub regions 321a, 321b, 323a, and 323b to reflect light in various directions, thereby increasing the light distribution.

Further, in the third embodiment, the number of the facets 320f may be reduced at a level of 50% of that in the second embodiment, and thus the workability of the reflecting portion 320 for forming the plurality of facets 320f may be improved.

Figure 12:
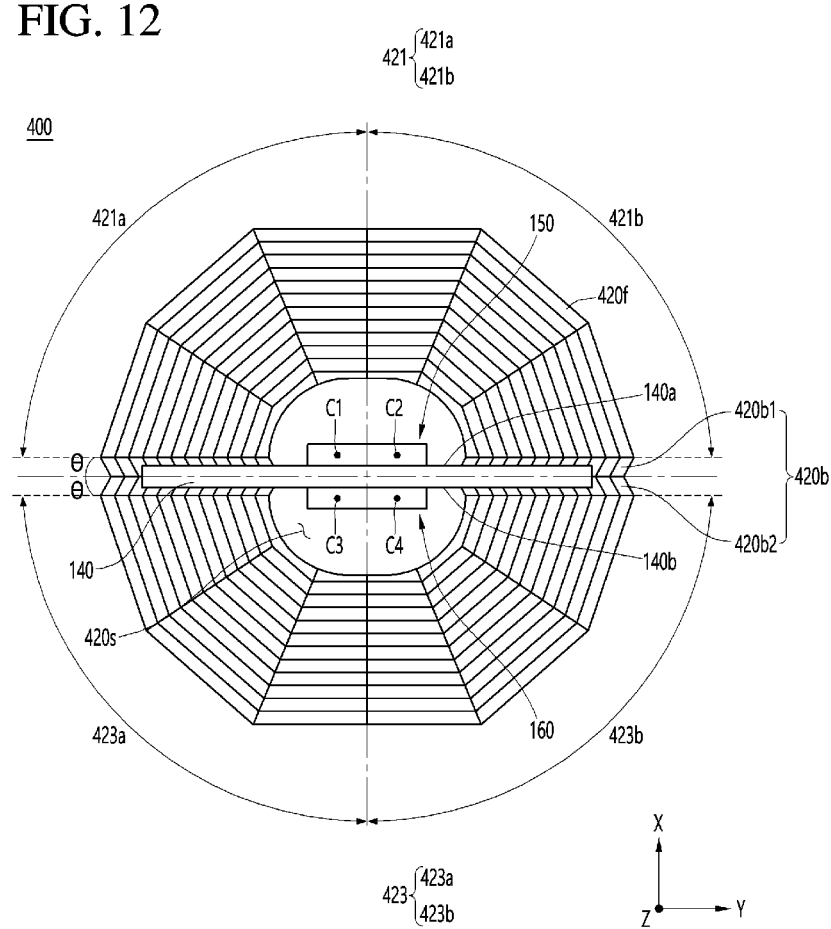
FIG. 12 is a plan view showing a light emitting module according to a fourth embodiment.

FIG. 12 is a plan view showing a light emitting module according to a fourth embodiment.

In the description of a light emitting module 400 of the fourth embodiment with reference to FIG. 12, descriptions identical to those of the contents described with reference to FIGS. 1 to 7 may be omitted.

The technical features of the light emitting module of the first embodiment may be employed to a width of an emission surface of a reflecting portion 420.

The reflecting portion 420 may include a first region 421 in which light of a first light emitting unit 160 is reflected, and a second region 423 in which light of a second light emitting unit 160 is reflected.

The first region 421 may face the first light emitting unit 150. The first region 421 may face one surface 140a of a substrate 140. The first region 421 may include a first sub region 421a and a second sub region 421b having different parabolic curve. Specifically, the first sub region 421a may have a parabola from a first reference C1 on which a first light emitting chip 151 is disposed. The second sub region 421b may have a parabola from a second reference C2 on which a second light emitting chip 153 is disposed. The light emitting module 400 of the fourth embodiment may provide the reflecting portion 420 having a parabolic curvature with respect to positions of the first and second light emitting chips 151 and 153, and thus a light distribution of the light emitting module 400 may be increased in consideration of the first and second light emitting chips 151 and 153 that emit light.

The second region 423 may face the second light emitting unit 160. The second region 423 may face another surface 140b of the substrate 140. The second region 423 may include a third sub region 423a and a fourth sub region 423b having different parabolic curve. Specifically, the third sub region 423a may have a parabola from a third reference C3 on which a third light emitting chip 161 is disposed. The fourth sub region 423b may have a parabola from a fourth reference C4 on which a fourth light emitting chip 163 is disposed. The light emitting module 400 of the fourth embodiment may provide the reflecting portion 420 having a parabolic curvature with respect to positions of the third and fourth light emitting chips 161 and 163, and thus the light distribution of the light emitting module 400 may be increased in consideration of the third and fourth light emitting chips 161 and 163 that emit light.

The reflecting portion 420 of the fourth embodiment may include a plurality of facets 420f. Here, the plurality of facets 420f may be provided on a surface of the reflecting portion 420 with a plurality of surfaces having different inclination angles. The plurality of facets 420f may provide light reflected in various directions at different inclination angles so that the light distribution of the light emitting module 400 may be increased. The plurality of facets 420f may have a concave surface shape. The plurality of facets 420f may have a convex surface shape. Further, the plurality of facets 420f may have a structure in which the concave surfaces or convex surfaces of the facets adjacent to each other are connected.

The plurality of facets 420f of the fourth embodiment may be connected to each other in a boundary region of the first and second sub regions 421a and 421b. Further, the plurality of facets 420f may be connected to each other in a boundary region of the third and fourth sub regions 423a and 423b. In the fourth embodiment, the facet 420f having the same inclination angle in the boundary region of the first and second sub regions 421a and 421b may be shared in a second direction Y. The facet 420f in the boundary region of the first and second sub regions 421a and 421b may share the first and second sub regions 421a and 421b. Specifically, a portion of the facet 420f in the boundary region of the first and second sub regions 421a and 421b is disposed in the first sub region 421a, and the other portion may be disposed in the second sub region 421b. In the fourth embodiment, the facet 420f having the same inclination angle in the boundary region of the third and fourth sub regions 423a and 423b may be shared in the second direction Y. Therefore, in the fourth embodiment, a total number of the facets 420b may be reduced, and thus the workability may be improved and the light distribution may be increased.

The reflecting portion 420 may include a boundary portion 420b disposed between the first sub region 421a and the third sub region 423a. Further, the reflecting portion 420 may include a boundary portion 420b disposed between the second sub region 421b and the fourth sub region 423b. That is, the boundary portion 420b may be disposed in a boundary region between the first region 421 and the second region 423. The boundary portion 420b may include a first surface 420b1 and a second surface 420b2 having inclination angles θ which are symmetrical to each other. For example, the first surface 420b1 may extend from the first sub region 421a, and the second surface 420b2 may extend from the second sub region 421b. The boundary portion 420b may include the plurality of facets 420f, and the number of the facets 420f in a third direction Z may correspond to the number of the facets 420f in a depth direction corresponding to the third direction Z of each of the first to fourth sub regions 421a, 421b, 423a, and 423b.

The first and second surfaces 420b1 and 420b2 may meet each other concavely in an inward direction of the reflecting portion 420 on an outer side surface of the reflecting portion 420. The first and second surfaces 420b1 and 420b2 may extend according to the parabolic curvature of each of the first region 421 and the second region 423 which are connected to each other. That is, the boundary portion 420b may have a structure formed concavely along an outer periphery of the reflecting portion 420.

In the fourth embodiment, the reflecting portion 420 including the plurality of sub regions having the parabolic curvature with respect to each of the light emitting chips may be provided, and thus the reflection efficiency may be improved. Therefore, in the fourth embodiment, a width of the emission surface of the reflecting portion 420 may be reduced to be smaller than in a general reflection structure, and thus the slimming of the emission surface of the light emitting module 400 may be realized. Accordingly, the fourth embodiment may be provided to lighting systems in various designs so that a degree of freedom in design may be improved.

Further, in the fourth embodiment, in the light emitting module 400 in which the first and second light emitting units 150 and 160 having different wavelengths are disposed with the substrate 140 interposed therebetween, the reflecting portion 420 including the plurality of sub regions having a parabolic curvature with respect to each of the light emitting chips included in the first and second light emitting units 150 and 160 may be provided, and thus the reduction of luminous intensity in a central region of the emission surface of light emitting module 400 may be improved.

Further, in the fourth embodiment, the plurality of facets 420f may be included in each of the first to fourth sub regions 421a, 421b, 423a, and 423b to reflect light in various directions, thereby increasing the light distribution.

Further, in the fourth embodiment, the plurality of facets 420f may be connected to each other in the boundary region of the first and second sub regions 421a and 421b and in the boundary region of the third and fourth sub regions 423a and 423b, and thus the total number of the facets 420f may be reduced and the workability may be improved.

Figure 13:
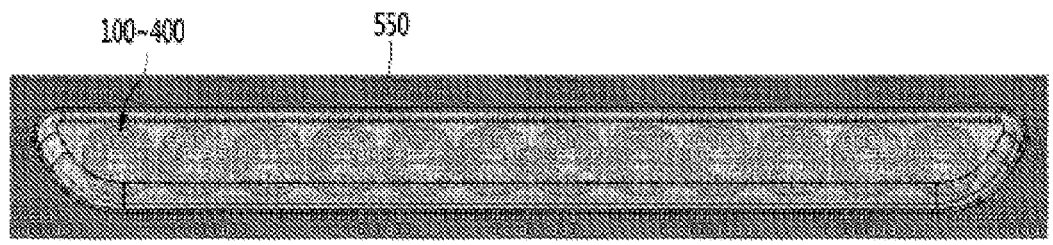
FIG. 13 is a plan view showing a lighting system including a light emitting module according to an embodiment.

FIG. 13 is a plan view showing a lighting system including a light emitting module according to an embodiment, FIG. 14 is a view showing a distribution of light emitted from a first light emitting unit of FIG. 13, and FIG. 15 is a view showing a distribution of light emitted from a second light emitting unit of FIG. 13.

Figure 17:
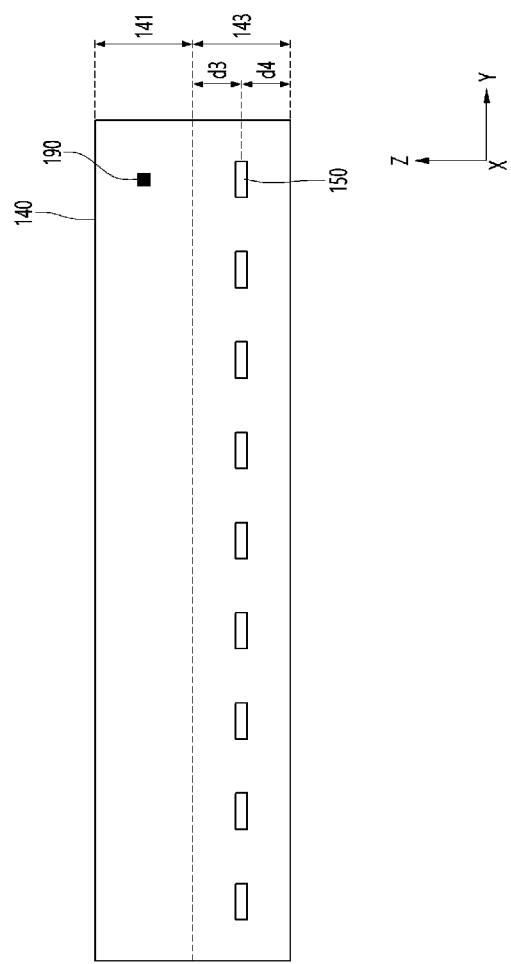
FIG. 17 is a plan view showing the first light emitting unit and a substrate of FIG. 14.

FIG. 16 is a perspective view showing the lighting system of FIG. 13, and FIG. 17 is a plan view showing the first light emitting unit and a substrate of FIG. 14.

As shown in FIGS. 1, and 13 to 16, the lighting system according to the embodiment may include a plurality of light emitting modules 100, 200, 300, and 400, and a cover portion 440 which covers the plurality of light emitting modules 100, 200, 300, and 400. Descriptions of the plurality of light emitting modules 100, 200, 300, and 400 which are identical to those of the contents described with reference to FIGS. 1 to 12 may be omitted.

In the lighting system according to the embodiment, a first light emitting unit 150 and a second light emitting unit 160, which emit light having different wavelengths, may be disposed with a substrate 140 interposed therebetween. For example, the lighting system according to the embodiment may be included in a lighting device of a front portion of an automobile. For example, the first light emitting unit 150 may emit white light and may include a daylight driving light function. The second light emitting unit 160 may emit light having at least one of a yellow wavelength, a red wavelength, and an orange wavelength, and may be a turn signal lamp. The first and second light emitting units 150 and 160 are not limited thereto, and the light emitting wavelengths thereof may be changed and functions may also be changed.

In the lighting system according to the embodiment, the first light emitting unit 150 and the second light emitting unit 160, which emit light having different wavelengths, may be disposed with the substrate 140 interposed therebetween. A reflecting portion 120 including a plurality of sub regions having a parabolic curvature with respect to each of light emitting chips included in the first light emitting unit 150 and the second light emitting unit 160 may be provided, and thus luminous intensity may be improved and a light distribution may be increased.

In the lighting system according to the embodiment, the reflecting portion 120 including the plurality of sub regions having the parabolic curvature with respect to each of the light emitting chips may be provided, and thus reflection efficiency may be improved. Therefore, in the embodiment, first and second widths W1 and W2 of the reflecting portion 120 may be reduced to be smaller than in a general reflection structure, and thus the slimming of the reflecting portion 120 may be realized. Accordingly, in the lighting system according to the embodiment, a degree of freedom in design may be improved.

In the lighting system according to the embodiment, the plurality of reflecting portions 120, 220, 320, and 420 may be disposed on one side of the substrate 140, and the first light emitting unit 150 and the second light emitting unit 160 may be disposed on the substrate 140 in a second direction Y. The second direction Y may correspond to a major axis direction of the substrate 140.

A first region 141 and a second region 143 may be provided in the substrate 140 in the second direction Y. Circuit driving units 190 (or elements) may be mounted in the first region 141, and the first light emitting unit 150 and the second light emitting unit 160 may be mounted in the second region 143. Further, the reflecting portions 120, 220, 320, and 420 may be disposed in the second region 143.

The arrangement positions of the first light emitting unit 150 and the second light emitting unit 160 disposed with the substrate 140 interposed therebetween may satisfy a relationship of d3:d4 ($1 \leq d3 \leq 7.5$ and $1 \leq d4 \leq 7.5$) in the second region 143 in the second direction Y. Here, d3 denotes a distance between the first light emitting unit 150 and the first region 141 in the second direction Y, and d4 denotes a distance between the first light emitting unit 150 and an end of the second region 143 in the second direction Y. When the arrangement position of the first light emitting unit 150 does not satisfy the relationship of d3:d4 ($1 \leq d3 \leq 7.5$ and $1 \leq d4 \leq 7.5$), an interval between the first light emitting unit 150 and an edge of the substrate 140 or the circuit driving elements may be reduced and heat dissipation efficiency may be lowered.

The lighting system according to the embodiment may be used for various purposes such as indicating devices, lighting devices, street lights, indoor lightings, and outdoor lightings.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present invention.

In addition, embodiments are mostly described above. However, they are only examples and do not limit the present invention. A person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A light emitting module comprising:
a driving unit disposed on a substrate to be adjacent to one side of the substrate;
a first light emitting unit disposed adjacent to another side of the substrate and disposed on one surface of the substrate;
a second light emitting unit disposed adjacent to the other side of the substrate, disposed on another surface of the substrate, and configured to emit light having a wavelength different from that of the first light emitting unit; and
a reflecting portion including a first region and a second region facing the first light emitting unit and the second light emitting unit,
wherein each of the first emitting unit and the second light emitting unit includes at least one light emitting chip,
wherein the first region and the second region include a plurality of sub regions having a parabolic curve with respect to the light emitting chip of each of the first light emitting unit and the second light emitting unit,
wherein the reflecting portion includes a plurality of facets,
wherein the reflecting portion is formed in a cup structure that includes a bottom surface having a hole structure, an emission surface having a hole structure and a reflecting surface between the bottom surface having the hole structure and the emission surface having the hole structure, wherein light is emitted outward through the emission surface having the hole structure, and the reflecting portion has a width that gradually increases from the bottom surface toward the emission surface,
wherein the plurality of facets are disposed in each of the plurality of sub regions, wherein the facets adjacent to each other have different inclination angles with respect to a first direction which is parallel to the one surface of the substrate,
wherein the emission surface and the bottom surface include boundary portions having inclination angles which are symmetrical to each other in boundary regions of the plurality of sub regions,
wherein the boundary portions include a structure formed concavely along an outer periphery of the reflecting portion,
wherein the first light emitting unit and the second light emitting unit overlap each other in the first direction with the substrate interposed therebetween,
wherein the one surface and the other surface of the substrate are disposed in parallel in a second direction which is orthogonal to the first direction, and
wherein an end of the substrate is disposed in a third direction which is orthogonal to the first direction and orthogonal to the second direction,
wherein the first light emitting unit and the second light emitting unit are spaced in a third direction adjacent to the bottom surface of the reflecting portion, the first light emitting unit is spaced in the third direction a first predetermined interval away from the bottom surface of the reflecting portion, and the second light emitting unit is spaced in the third direction a second predetermined interval away from the bottom surface of the reflecting portion, wherein the first light emitting unit and the second light emitting unit are not overlapped in the first direction with the reflecting portion, wherein the first light emitting unit and the second light emitting unit are not disposed inside the reflecting portion and are disposed on an outer periphery of the reflecting portion and exposed to outside.

2. The light emitting module of claim 1, wherein the plurality of sub regions include a first sub region, a second sub region, a third sub region, and a fourth sub region, wherein the first sub region to the fourth sub region are connected to each other, wherein the boundary regions of the first sub region to the fourth sub region are in contact with each other in a structure formed convexly along an outer periphery of the reflecting portion.

3. The light emitting module of claim 1, wherein the plurality of facets have convex surfaces or concave surfaces on an inner side surface of the reflecting portion.

4. The light emitting module of claim 2, wherein the plurality of facets are provided with twelve or more facets in a circumferential direction and a depth direction of the reflecting portion.

5. The light emitting module of claim 1, wherein a second width of the emission surface in the second direction is greater than or equal to a first width of the emission surface in the first direction which is parallel to the one surface of the substrate.

6. The light emitting module of claim 1, wherein the plurality of sub regions include a first sub region to a fourth sub region, the boundary portions include a first surface and a second surface which are symmetrical to each other, and wherein the first surface extends from the first sub region, wherein the second surface extends from the second sub region, wherein the first surface and the second surface have a shape concavely bent in an inward direction of the reflecting portion on an outer side surface of the reflecting portion, and wherein the boundary portions are disposed corresponding to a central region of the first light emitting unit.

7. The light emitting module of claim 1, wherein the boundary portions extend from the plurality of sub regions, extend corresponding to inclination angles of the plurality of sub regions along an outer side surface of the reflecting portion, and meet each other.

8. The light emitting module of claim 2, wherein the plurality of facets disposed in each of the plurality of sub regions is obtained by the following expression:

$$M:N \ (M \geq 8 \text{ and } N \geq 3),$$

wherein M denotes a total number of facets disposed in a circumferential direction of the reflecting portion, and N denotes a total number of facets disposed in a depth direction of the reflecting portion.

9. The light emitting module of claim 2, wherein the plurality of facets have the same width and the same area in a circumferential direction of the reflecting portion.

10. The light emitting module of claim 2, wherein the plurality of sub regions include a first sub region, a second sub region, a third sub region, and a fourth sub region, wherein the first sub region to the fourth sub region are connected to each other, wherein boundary regions of the first sub region to the fourth sub region are in contact with each other in a structure formed convexly along an outer periphery of the reflecting portion.

11. The light emitting module of claim 1, wherein the plurality of facets include a structure in which concave surfaces and convex surfaces of the facets adjacent to each other are connected.

12. The light emitting module of claim 1, wherein the plurality of facets are provided with eight facets in a circumferential direction of the reflecting portion, wherein the plurality of facets are provided with five or less facets in a depth direction corresponding to the third direction of the reflecting portion.

13. A light emitting module comprising:

a driving unit disposed on a substrate to be adjacent to one side of the substrate;

a first light emitting unit disposed adjacent to another side of the substrate and disposed on one surface of the substrate;

a second light emitting unit disposed adjacent to the other side of the substrate, disposed on another surface of the substrate, and configured to emit light having a wavelength different from that of the first light emitting unit; and a reflecting portion including a first region and a second region facing the first light emitting unit and the second light emitting unit, wherein each of the first light emitting unit and the second light emitting unit includes at least one light emitting chip, wherein the first region and the second region include a plurality of sub regions having a parabolic curve with respect to the light emitting chip of each of the first light emitting unit and the second light emitting unit, wherein the reflecting portion includes a plurality of facets, wherein the reflecting portion is formed in a cup structure that includes a bottom surface having a hole structure, an emission surface having a hole structure and a reflecting surface between the bottom surface having the hole structure and the emission surface having the hole structure, wherein light is emitted outward through the emission surface having the hole structure, and the reflecting portion has a width that gradually increase from the bottom surface toward the emission surface, wherein the plurality of facets are disposed in each of the plurality of sub regions, wherein the facets adjacent to each other have different inclination angles with respect to a first direction which is parallel to the one surface of the substrate, wherein the emission surface and the bottom surface include boundary portions having inclination angles which are symmetrical to each other in boundary regions of the plurality of sub regions, wherein the boundary portions include a structure formed concavely along an outer periphery of the reflecting portion, wherein the first light emitting unit and the second light emitting unit overlap each other in the first direction which is parallel to the one surface of the substrate, and are disposed on an outer periphery of the bottom surface of the reflecting portion, wherein the substrate includes an end protruding from the bottom surface of the reflecting portion to an inner side of the reflecting portion, and wherein distances between the end protruding and the bottom surface of the reflecting portion and the emission surface of the reflecting portion satisfy the following relationship, $d1:d2 (1 \leq d1 \leq 10$ and $10 \leq d2 \leq 15)$, wherein d1 denotes a distance from the bottom surface of the reflecting portion to the end, and d2 denotes a distance in a depth direction of the reflecting portion.

14. A lighting system comprising:

a light emitting module; and a cover portion configured to cover the light emitting module, wherein the light emitting module includes a substrate, a driving unit disposed on the substrate to be adjacent to one side of the substrate, a first light emitting unit disposed adjacent to another side of the substrate and disposed on one surface of the substrate, a second light emitting unit disposed adjacent to the other side of the substrate, disposed on another surface of the substrate, and configured to emit light having a wavelength different from that of the first light emitting unit, and a reflecting portion including a first region and a second region facing the first light emitting unit and the second light emitting unit, wherein each of the first light emitting unit and the second light emitting unit includes at least one light emitting chip, wherein each of the first region and the second region includes a plurality of sub regions having a parabolic curvature with respect to the light emitting chip of each of the first light emitting unit and the second light emitting unit, wherein the reflecting portion is formed in a cup structure that includes a bottom surface having a hole structure, an emission surface having a hole structure and a reflecting surface between the bottom surface having the hole structure and the emission surface having the hole structure, wherein light is emitted outward through the emission surface having the hole structure, and the reflecting portion has a width that gradually increases from the bottom surface toward the emission surface, wherein the emission surface and the bottom surface include boundary portions having inclination angles which are symmetrical to each other in boundary regions of the plurality of sub regions, wherein the boundary portions include a structure formed concavely along an outer periphery of the reflecting portion, wherein the first light emitting unit and the second light emitting unit overlap each other in the first direction with the substrate interposed therebetween, wherein the one surface and the other surface of the substrate are disposed in parallel in a second direction which is orthogonal to the first direction, and wherein an end of the substrate is disposed in a third direction which is orthogonal to the first direction and orthogonal to the second direction, wherein the first light emitting unit and the second light emitting unit are spaced adjacent to the bottom surface of the reflecting portion, the first light emitting unit is spaced in the third direction a first predetermined interval away from the bottom surface of the reflecting portion, and the second light emitting unit is spaced in the third direction a second predetermined interval away from the bottom surface of the reflecting portion, wherein the first light emitting unit and the second light emitting unit are not overlapped in the first direction with the reflecting portion, wherein the first light emitting unit and the second light emitting unit are not disposed inside the reflecting portion and are disposed on an outer periphery of the reflecting portion and exposed to outside.

* * * * *